(12) United States Patent
Li et al.

(10) Patent No.: US 9,557,348 B2
(45) Date of Patent: Jan. 31, 2017

(54) SEMICONDUCTOR TESTING STRUCTURES AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Nan Li, Shanghai (CN); Lilung Lai, Shanghai (CN); Ling Zhu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/567,362

(22) Filed: Dec. 11, 2014

(65) Prior Publication Data

US 2015/0316583 A1 Nov. 5, 2015

(30) Foreign Application Priority Data

May 4, 2014 (CN) .......................... 2014 1 0185201

(51) Int. Cl.

| | |
|---|---|
| *G01Q 30/20* | (2010.01) |
| *G01Q 60/46* | (2010.01) |
| *C23F 1/00* | (2006.01) |
| *B32B 37/18* | (2006.01) |
| *B32B 38/10* | (2006.01) |

(Continued)

(52) U.S. Cl.
CPC .............. *G01Q 60/46* (2013.01); *B32B 37/18* (2013.01); *B32B 38/10* (2013.01); *C23F 1/00* (2013.01); *G01B 21/20* (2013.01); *G01Q 30/20* (2013.01); *H01L 22/14* (2013.01)

(58) Field of Classification Search
CPC ......... G01Q 30/20; B32B 38/10; B32B 37/18; C23F 1/00; G01B 21/20
USPC .............................. 850/18; 156/247; 216/36
See application file for complete search history.

(56) References Cited

U.S. PATENT DOCUMENTS

2004/0264837 A1* 12/2004 Ogawa ..................... G02B 6/42
385/14

* cited by examiner

*Primary Examiner* — Selim Ahmed
(74) *Attorney, Agent, or Firm* — Anova Law Group, PLLC

(57) ABSTRACT

A method is provided for fabricating a semiconductor testing structure. The method includes providing a substrate having a to-be-tested device structure formed on a surface of the substrate, a dielectric layer formed on the surface of the substrate and a surface of the to-be-tested structure, and conductive structures and an insulation layer electrically insulating the conductive structures formed on a first surface of the dielectric layer. The method also includes planarizing the conductive structures and the insulation layer to remove the conductive structures and the insulation layer until the first surface of the dielectric layer is exposed; and bonding the first surface of the dielectric layer with a dummy wafer by an adhesive layer. Further, the method includes removing the substrate to expose a second surface relative to the first surface of the dielectric layer of the dielectric layer and a surface of the to-be-tested device structure.

16 Claims, 7 Drawing Sheets

(51) Int. Cl.
*G01B 21/20* (2006.01)
*H01L 21/66* (2006.01)

SEMICONDUCTOR TESTING STRUCTURES AND FABRICATION METHOD THEREOF

CROSS-REFERENCES TO RELATED APPLICATIONS

This application claims the priority of Chinese patent application No. 201410185201.3, filed on May 4, 2014, the entirety of which is incorporated herein by reference.

FIELD OF THE INVENTION

The present invention generally relates to the field of semiconductor manufacturing technology and, more particularly, relates to semiconductor testing structures and fabrication techniques thereof.

BACKGROUND

Scanning probe microscopy (SPM) is a microscopy technology which is able to form images of specific targets using different sensing modalities. SPM is based on the controlling of the interaction between the sample surface and the probe and the scanning of the probe on or near the sample surface. To form images, SPM raster scans the probe over the sample surface, the surface information, such as height, or phase, etc., can be recorded and reconstructed by a computer. The type of the surface information depends on the different types of interaction between the probe and the sample surface.

There are a plurality of established types of SPMs, such as scanning capacitance microscopy (SCM), scanning tunneling microscopy (STM), magnetic force microscopy (MFM), and atomic force microscopy (AFM), etc. The interaction between the probe and the sample surface can be categorized as a contact mode, a non-contact mode, or an intermittent mode (or taping mode), etc.

Amongst of the SPMs, SCM is able to obtain a two-dimensional doping profile of the to-be-test device structure with a spatial resolution in a range of approximately 10 nm~15 nm and a doping concentration in a range of approximately 1E15 atoms/$cm^3$~1E20 atoms/$cm^3$. SCM is a contact mode SPM, during the imaging process, the probe needs to contact with the sample surface; and mechanically scan on the sample surface; and thus it requires the sample surface to be significantly smooth to obtain the electrical signals.

However, the surface roughness of the to-be-tested device structure formed by an existing method is relatively large; it is unable to match the requirements for performing the contact mode SCM testing. The disclosed device structures and methods are directed to solve one or more problems set forth above and other problems

BRIEF SUMMARY OF THE DISCLOSURE

One aspect of the present disclosure includes a method for fabricating a semiconductor testing structure. The method includes providing a substrate having a to-be-tested device structure formed on a surface of the substrate, a dielectric layer formed on the surface of the substrate and a surface of the to-be-tested structure, and conductive structures and an insulation layer electrically insulating the conductive structures formed on a first surface of the dielectric layer. The method also includes planarizing the conductive structures and the insulation layer to remove the conductive structures and the insulation layer until the first surface of the dielectric layer is exposed; and bonding the first surface of the dielectric layer with a dummy wafer by an adhesive layer. Further, the method includes removing the substrate to expose a second surface relative to the first surface of the dielectric layer of the dielectric layer and a surface of the to-be-tested device structure.

Another aspect of the present disclosure includes a semiconductor testing structure. The semiconductor testing structure includes a dummy wafer, and an adhesive layer formed on the dummy wafer. The semiconductor testing structure also includes a dielectric layer having a first surface bonded with the dummy wafer by the adhesive layer; and a to-be-tested device structure with an even and smooth surface exposed by a second surface relative to the first surface of the dielectric layer of the dielectric layer formed in the dielectric layer.

Another aspect of the present disclosure includes a semiconductor testing method. The semiconductor testing method includes providing a semiconductor testing structure having a to-be-tested device structure with an even and smooth testing surface. The semiconductor testing method also includes providing a testing apparatus having a probe. Further, the semiconductor testing method includes moving the probe of the testing apparatus over the testing surface of the to-be-tested device structure of the semiconductor testing structure to obtain testing information in the to-be-tested device structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
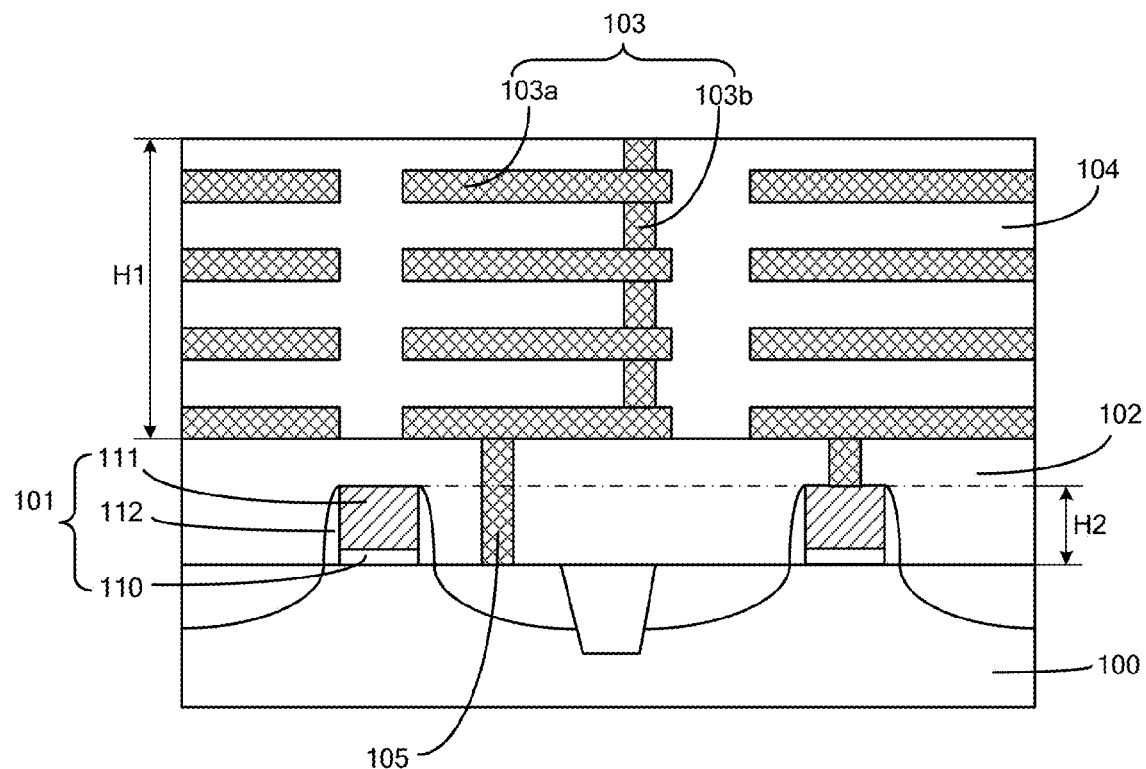
FIGS. 1~2 illustrate certain semiconductor structures corresponding to an existing fabrication process of a semiconductor testing structure.
Figure 2:
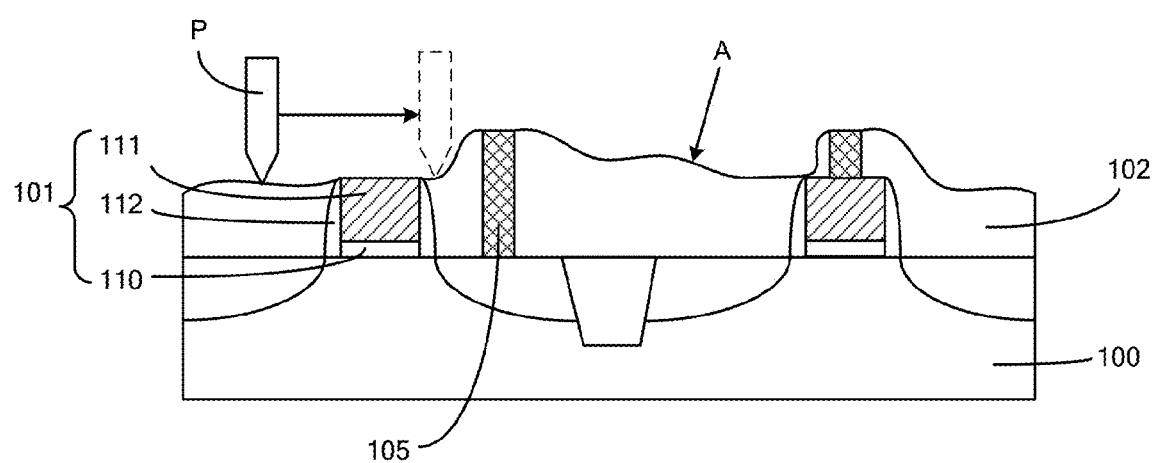

FIGS. 1~2 illustrate certain semiconductor structures corresponding to an existing fabrication process of a semiconductor testing structure. As shown in FIG. 1, the fabrication process may include providing a substrate 100 having a to-be-tested gate structure 101. A dielectric layer 102 may be formed on the surface of the substrate 100 and the to-be-tested gate structure 101. Further, a conductive structure 103 and an insulation layer 104 used for electrically insulating the conductive structure 103 may be formed on the surface of the dielectric layer 102. The conductive structure 103 may electrically connect with the substrate 100 and/or the to-be-test structure 101 through a conductive via 105 formed in the dielectric layer 102.

Further, as shown in FIGS. 1~2, the conductive structure 103 may include a plurality stacked conductive layers 103*a*, and a plurality of conductive vias 103*b* electrically connecting with the conductive layers 103*a* formed between adjacent conductive layers 103*a*. The to-be-tested gate structure 101 may include a gate dielectric layer 110 formed on the surface of the substrate 100, a gate electrode layer 111 formed on the surface of the gate dielectric layer 110; and sidewall spacers 112 formed on side surfaces of the gate dielectric layer 110 and the gate electrode layer 111. The gate electrode layer 111 may be doped with a certain type of ions; the doping concentration of the doping ions may be subsequently imaged.

Further, as shown in FIG. 2, after providing the substrate 100 with the to-be-tested gate structure 101 and the conductive structure 103, a polishing process may be performed onto the conductive structure 103 and the insulation layer 104 until the surface of the gate dielectric layer 102 and the top surface of the gate electrode layer 111 are exposed. Thus, a to-be-tested surface "A" may be formed.

Referring to FIG. 2, when the to-be-tested gate structure 101 is being tested to obtain the doping concentration profile by a SCM, the probe "P" of the SCM may contact with the to-be-tested surface "A"; and move along a direction parallel to the surface of the substrate 100. Thus, the doping concentration in the gate electrode layer 111 may be obtained.

However, it may be unable to obtain a smooth and even to-be-tested surface "A" by the polishing process. Especially when the conductive vias 105 are formed in the dielectric layer 102, the polishing rate of the dielectric layer 102 and the polishing rate of the conductive vias 105 may be different. Thus, after the polishing process, the top surface of the conductive vias 105 may protrude from the surface of the dielectric layer 102. When the probe "P" of the SCM moves on the surface of the dielectric layer 102, the probe "P" may bump on the protruding conductive vias 105, and may be damaged. Therefore, the to-be-tested surface "A" of the semiconductor testing structure may not match the requirements for performing the SCM testing.

Further, as shown in FIG. 1, the conductive structure 103 and the insulation layer 104 may have a first thickness "H1"; and the to-be-tested gate structure 101 may have a second thickness "H2". The first thickness "H1" may be significantly greater than the second thickness "H2". Therefore, when the polishing process is performed onto the conductive structure 103 and the insulation layer 104, it may be difficult to precisely control the stop position of the polishing process, and the testing target (the to-be-tested gate structure 101) may be lost after the polishing process. According to the disclosed device structures and methods, the rough to-be-tested surface issue and the other issues may be overcome by removing the substrate of the semiconductor testing structure to obtain an even and smooth testing surface.

Figure 13:
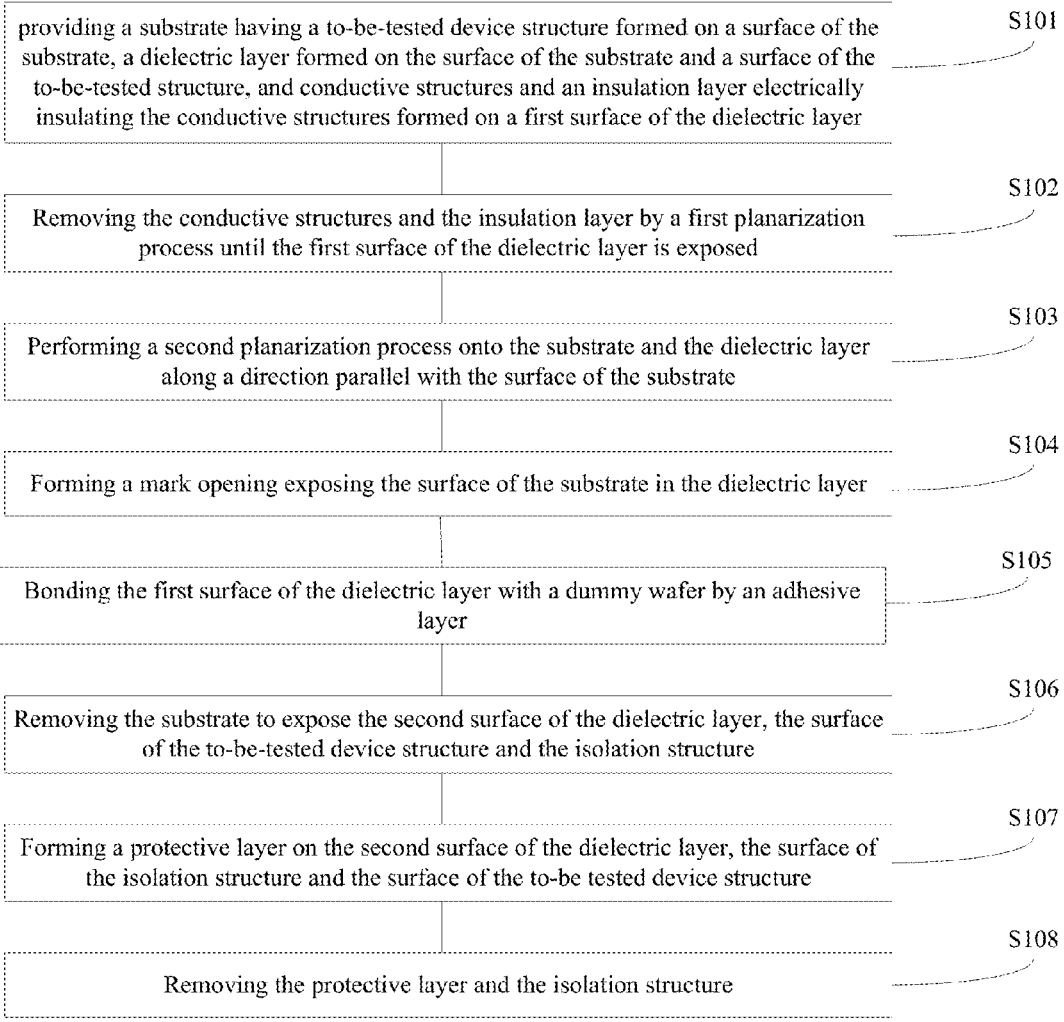
FIG. 13 illustrates an exemplary fabrication process of a semiconductor testing structure consistent with the disclosed embodiments.

FIG. 13 illustrates an exemplary fabrication process of a semiconductor testing structure consistent with the disclosed embodiments; and FIGS. 3-10 illustrate semiconductor structures corresponding certain stages of the exemplary fabrication process.

Figure 3:
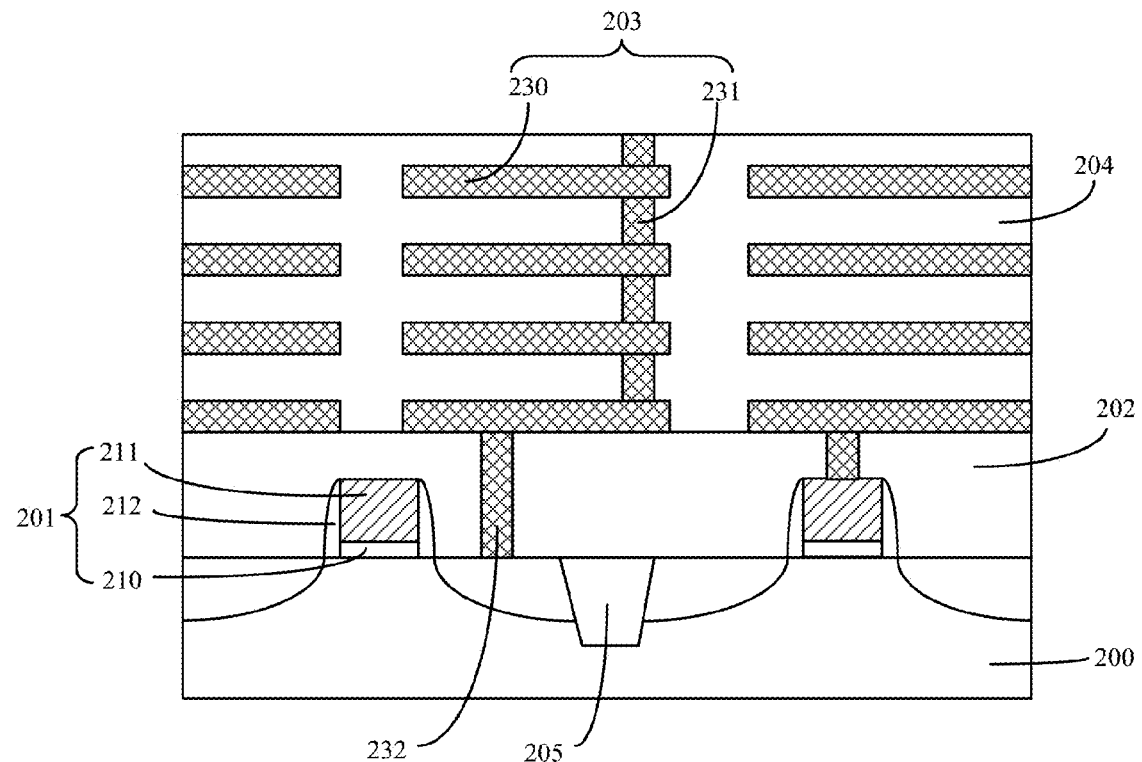
FIGS. 3~10 illustrate semiconductor structures corresponding to certain stages of a fabrication process of a semiconductor testing structure consistent with the disclosed embodiments.

As shown in FIG. 13, at the beginning of the fabrication process, a substrate with certain structures is provided (S201). FIG. 3 illustrates a corresponding semiconductor structure.

As shown in FIG. 3, a substrate 200 is provided; and the substrate 200 may have a to-be-tested device structure 201 formed on the surface of the substrate 200. Further, a dielectric layer 202 may be formed on the surface of the substrate 200 and the to-be-tested device structure 201. Further, a plurality of the conductive structures 203 and an insulation layer 204 electrically insulating the conductive structures 203 may be formed on the first surface of the dielectric layer 202.

The substrate 200 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium nitride, gallium antimonite, alloy semiconductor or a combination thereof. The substrate 200 may also be a glass substrate. In one embodiment, the substrate 200 is silicon.

Further, the substrate 200 may have a plurality of active areas (AA) (not labeled). Semiconductor devices (not labeled) may be formed on the surface the active areas of the substrate 200. The semiconductor devices and the conductive structures 203 may together form an integrated circuit which is able to perform certain functions.

In one embodiment, as shown in FIG. 3, an isolation structure 205 may be formed in the substrate 200. The isolation structure 205 may be a shallow trench isolation (STI) structure configured to isolate adjacent active areas. In one embodiment, the isolation structure 205 is made of silicon oxide. In certain other embodiments, the isolation structure 205 may be made of silicon oxynitride, silicon nitride, silicon carbide, or low dielectric constant (low-K) material, etc. In certain other embodiments, the isolation structure 205 may be omitted.

The semiconductor devices may include a to-be-tested device structure 201; and a scanning capacitance microscope (SCM) may be used to subsequently test the to-be-tested device structure 201. In one embodiment, the to-be-tested device structure 201 is a gate structure. The gate structure may include a gate dielectric layer 210 formed on the surface of the substrate 200, a gate electrode layer 211 formed on the gate dielectric layer 210 and sidewall spacers 212 formed on the side surfaces of the gate electrode layer 211 and the gate dielectric layer 210.

The gate electrode layer 211 may be made of any appropriate material, such as polysilicon, or metal, etc. In one embodiment, the gate electrode layer 211 is made of polysilicon. The gate electrode layer 211 may be doped with P-type ions or N-type ions. The SCM may be used to subsequently obtain the doping profile of the P-type ions or the N-type ions in the gate electrode layer 211.

The gate dielectric layer 210 may be made of any appropriate material, such as silicon oxide, silicon nitride, or silicon oxynitride, etc. In one embodiment, the gate dielectric layer 210 is made of silicon oxide.

The sidewall spacers 212 may be a single layer structure, or a multiple-stacked structure. In one embodiment, the sidewall spacers 212 are made of one or more of silicon oxide, silicon nitride, and silicon oxynitride, etc.

The gate structure 201 may be used to form a transistor, thus source/drain regions (not labeled) may be formed in the substrate 200 at both sides of the gate structure 201. The source/drain regions may be doped with P-type ions or N-type ions by any appropriate process.

Referring to FIG. 3, the conductive structures 203 may electrically connect with the semiconductor devices, and/or the source/drain regions in the substrate 200. The conductive structures 203 may include a plurality of stacked conductive layers 230; and a plurality of first conductive vias 231 electrically connecting with adjacent conductive layers 230 formed between conductive layers 230. The conductive layers 230 may be made of Cu, W, or Al, etc. The first conductive vias 231 may be made of one or more of Cu, W, Al, Ti, Ta, TiN, and TaN, etc.

Further, referring to FIG. 3, the adjacent conductive layers 230 may be electrically insulated by the insulation layer 204. The adjacent conductive layers 230 may be electrically connected by the first conductive vias 231 formed in the insulation layer 204. The insulation layer 204 may be made of any appropriate material, such as silicon oxide, silicon nitride, silicon oxynitride, low-K dielectric material, or ultra low-K dielectric material, etc.

In one embodiment, in order to connect the conductive structures 203 with the semiconductor devices and/or the source/drain regions in the substrate 200, the second conductive vias 232 may be formed in the dielectric layer 202. The second conductive vias 232 may electrically connect with the bottom conductive layer 230. The second conductive vias 232 may be made of any appropriate material, such as one or more of Cu, W, Al, Ti, Ta, TiN, and TaN, etc.

Figure 4:
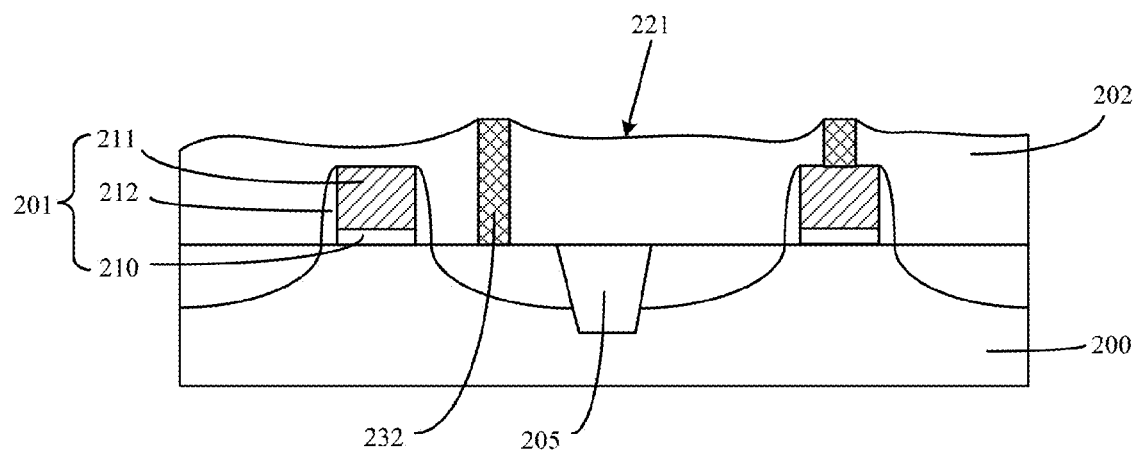

Returning to FIG. 13, after providing the substrate 200 with the conductive structures 203 and the to-be-tested structure 201, the conductive structures 203 and the insulations layer 204 may be removed (S102). FIG. 4 illustrates a corresponding semiconductor structure.

As shown in FIG. 4, the conductive structures 203 and the insulation layer 204 are removed; and the first surface 221 of the dielectric layer 202 is exposed. As used herein, the first surface of the dielectric layer 202 may refer to the surface of the dielectric layer 202 contacting with the bottom conductive layer 230 and the insulation layer 204.

The conductive structures 203 and the insulation layer 204 may be removed by performing a first planarization process onto the conductive structures 203 and the insulation layer 204 until the first surface 221 of the dielectric layer 202 is exposed. The first planarization process may start from the top surface of the insulation layer 204 or the top surface of the top conductive layer 230 toward the top surface of the dielectric layer 202 along a direction perpendicular to the surface of the substrate 200. Thus, the conductive structures 203 and the insulation layer 204 may be removed, and the first surface 221 of the dielectric layer 202 may be exposed. The removal of the conductive structures 203 and the dielectric layer 204 may prevent the conductive structures 203 from affecting the accuracy of the subsequent SCM testing. The first planarization process may be a chemical mechanical polishing process, or a physical mechanical polishing process, etc.

In one embodiment, referring to FIG. 4, the second conductive vias 232 electrically connecting with the conductive layers 230 may be formed in the dielectric layer 202, and the planarizing rate of the first planarization process to the dielectric layer 202 and the planarizing rate of the first planarization process to the second conductive vias 232 may be different, thus the exposed first surface 221 of the dielectric layer 202 may be uneven. In one embodiment, the top surface of the second conductive vias 232 may protrude from the first surface of 221 of the dielectric layer 202 after the first planarization process.

Referring to FIG. 4, the first planarization process may only need to remove the conductive structure 202 and expose the first surface 221 of the dielectric layer 202. That is, the first planarization process may not need expose the surface of the to-be-tested device structure 201. Therefore, the first planarization process may not damage the to-be-tested device structure 201; and the completeness of the to-be-tested device structure 201 may be ensured.

Figure 5:
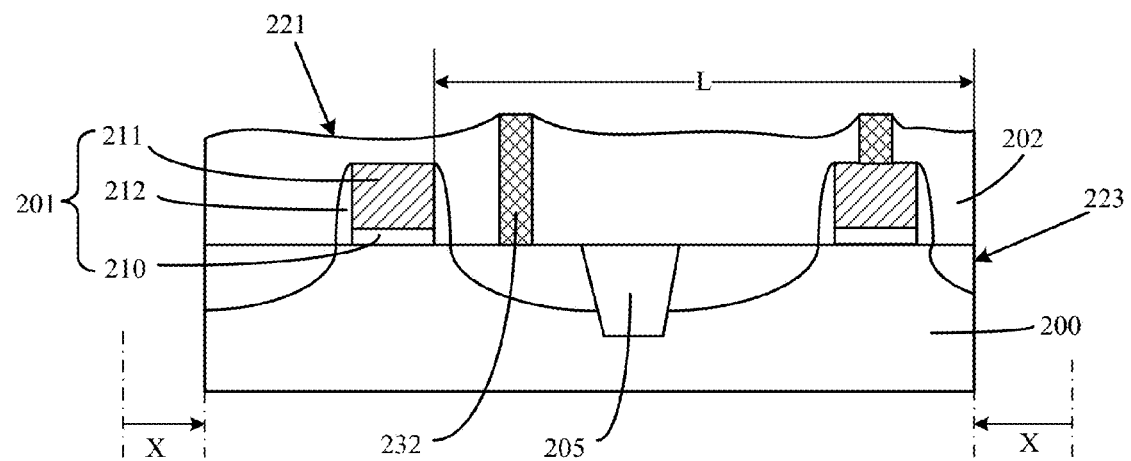

Returning to FIG. 13, after the first planarization process, a second planarization process may be performed (S103). FIG. 5 illustrates a corresponding semiconductor structure.

Figure 6:
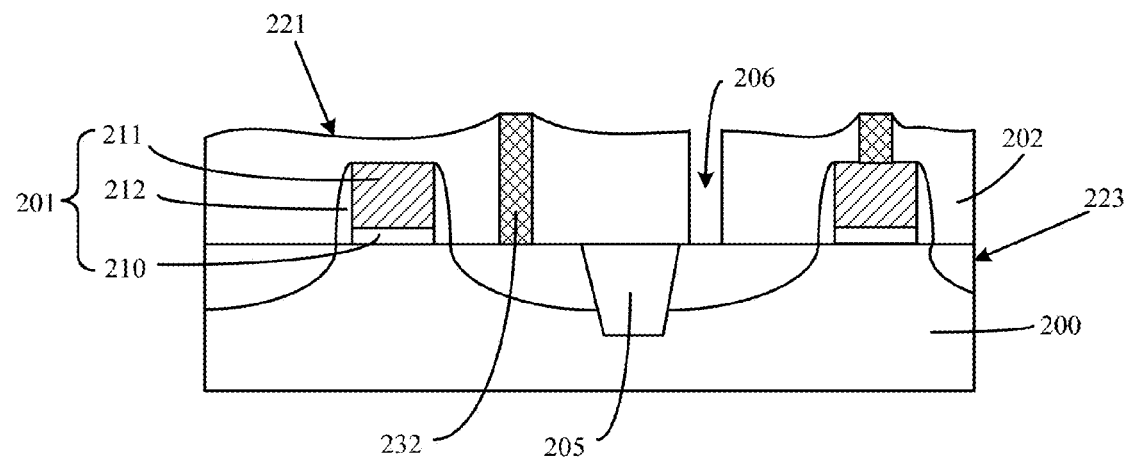

As shown in FIG. 6, a third surface 223 may be formed by performing the second planarization process onto the substrate 200 and the dielectric layer 202. The third surface 223 is perpendicular to the surface of the substrate 200. Further, the third surface 223 may have a pre-determined distance "L" with the to-be-tested device structure 201. The second planarization process may start from the edge of the substrate 200 and toward the to-be-tested device structure 201 along a direction "X" parallel with the surface of the substrate 200.

The second planarization process may be used to abstract a portion of the substrate 200, a portion of the dielectric layer 202 and the to-be-tested device structure 201 on the surface of a portion of the substrate 200 used for the subsequent SCM testing. That is, the size of the substrate 200 and the dielectric layer 202 may be reduced by the second planarization process and the to-be-tested devices structure 201 may keep intact. The size of the abstracted substrate 200 and the dielectric layer 202 may be relative small. A second focused ion beam (FIB) etching process may be subsequently used to remove the isolation structure 205 after removing the substrate 200, the reduced size of the abstracted substrate 200 and the dielectric layer 202 may cause the FIB etching process to be easily performed. Thus, the excess damages onto the subsequently exposed second surface of the dielectric layer 202 and the surface of the to-be-tested device structure 201 may be avoided.

The second planarization process may start from different positions of the edge of the substrate 200 and toward the to-be-tested device structure 201 such that the third surface 223 may always have the pre-determined distance "L" with the to-be-tested device structure 201. The pre-determined distance "L" may be in a range of approximately 1 μmμ5 μm.

The second planarization process may be a chemical mechanical polishing process, or a physical mechanical polishing process, etc. After the second planarization process, there may be another gate structure and the second conductive via 232 on the surface of the substrate 200 besides the to-be-tested device structure 201. In certain other embodiments, there may be only the to-be-tested device structures 201 and the dielectric layer 202 on the surface of the semiconductor substrate 200 after the second planarization process.

Returning to FIG. 13, after forming the third surface 223, a mark opening may be formed (S104). FIG. 6 illustrates a corresponding semiconductor structure.

As shown in FIG. 6, a mark opening 206 is formed in the dielectric layer 202, and the mark opening 206 may expose the surface of the substrate 200. A second FIB etching process may used to subsequently remove the isolation structure 205; and the mark opening 206 may be used to define the stop position of the second FIB etching process so as to ensure the subsequently exposed second surface of the dielectric layer 202 and the surface of the to-be-tested device structure 201 to have a minimum damage.

The mark opening 206 may be formed by any appropriate process. In one embodiment, the mark opening 206 is form by a first FIB etching process. The ion source of the FIB etching process may be a gallium source, or o inert gas source, etc. The accelerating voltage of the first FIB process may be in a range of approximately 1 kV-30 kV. A first FIB etching process may include selecting the spot for forming the mark opening 206 on first surface of the dielectric layer 202; and turn on the ion beam to bombast the dielectric layer 202 until the surface of the substrate 200 is exposed. Thus, the mark opening 206 is formed. In one embodiment, the mark opening 206 may expose a source region or a drain region in the substrate 200. Because the status of the bottom of the mark opening 206 may be in situ observed during the first FIB etching process, when the surface of the substrate 206 is exposed by the bottom the mark opening 206, the first FIB etching process may be stopped.

Figure 7:
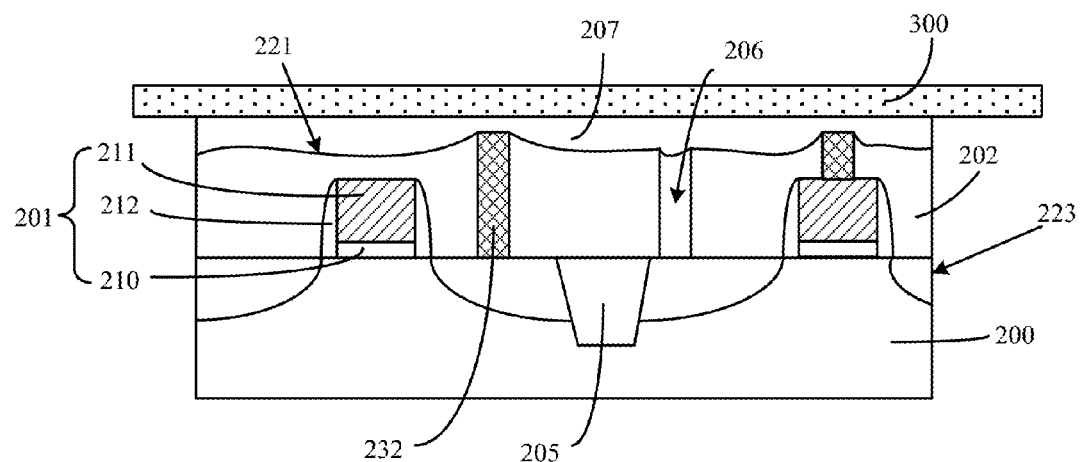

Returning to FIG. 13, after forming the mark opening 206, the first surface 221 may be bonded with a dummy wafer (S105). FIG. 7 illustrates a corresponding semiconductor structure.

As shown in FIG. 7, the first surface 221 of the dielectric layer 202 is bonded with a dummy wafer 300 by an adhesive layer 207. The dummy wafer 300 may be used to fix the substrate 200, the to-be-tested device structure 201 and the dielectric layer 202 on the substrate 200 during subsequent processes for removing the substrate 200 and the isolation structure 205.

The dummy wafer 300 may be a bare silicon wafer, a glass substrate, a resin substrate, or a ceramic substrate, etc. The adhesive layer 207 may be an organic material with adhesive property, such as epoxy, or wax, etc. In one embodiment, the adhesive layer 207 is wax.

The adhesive layer 207 may be spin-coated on the first surface 221 of the dielectric layer 202; and then the dummy wafer 300 may be adhered on the adhesive layer 207. Thus, the first surface 221 of the dielectric layer 202 may be fixed with the dummy wafer 300. Further, referring to FIG. 7, the surface tension of the adhesive layer 207 may be significantly large, thus the adhesive layer 207 may cover the top of the mark opening 206; and may not fall down into the mark openings 206, and the mark opening 206 may become a chamber after being covered by the adhesive layer 207. After subsequently removing the substrate 200, the mark opening 206 may be re-opened.

Figure 8:
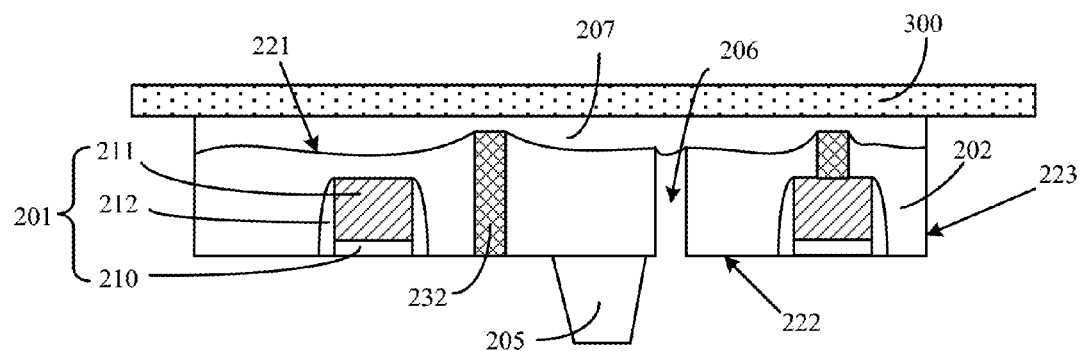

Returning to FIG. 13, after bonding the first surface 221 of the dielectric layer 202 with the dummy wafer 300, the substrate 200 may be removed (S106). FIG. 8 illustrates a corresponding semiconductor structure.

As shown in FIG. 8, the substrate 200 is removed; and the second surface 222 of the dielectric layer 202 and the surface of the to-be-tested device structure 201 are exposed. As used herein, the second surface of the dielectric layer 202 may refer to the surface of the dielectric layer 202 contacts with the substrate 200. The second surface 222 of the dielectric layer 202 may level with the surface of the to-be-tested device structure 201.

A process for removing the substrate 200 may include performing a third planarization process onto the substrate 200 and the dielectric layer 202 until the substrate 200 has a pre-determined thickness; and followed by etching the remained substrate 200 to expose the second surface 222 of the dielectric layer 202 and the surface of the to-be-tested device structure 201.

The third planarization process may be used to thin the substrate 200 so as to reduce the distance between the surface of the substrate 200 and the second surface 222 of the dielectric layer 202. Such a process may cause the subsequent etching process to be easily performed. The third planarization process may be a chemical mechanical polishing process, a physical mechanical polishing process, or an ion beam polishing process, etc. In one embodiment, the third planarization process is a chemical mechanical polishing process.

The etching process may be used to remove the remained substrate 200 after the third planarization process. The etching process may have an etching selectivity to the substrate 200 and the dielectric layer 202 or the isolation structure 205, thus the substrate 200 may be removed and the dielectric layer 202 and the isolation structure 205 may be exposed. Because the isolation structure 205 may be formed in the substrate 200, after removing the remained substrate 200 by the etching process, the isolation structure 205 may protrude from the second surface 222 of the dielectric layer 202. Therefore, it may need to subsequently remove the isolation structure 205 to obtain an even surface of the second surface 222 of the dielectric layer 202 and the to-be-tested device structure 201 for a subsequent testing process.

The etching process may be a dry etching process, or a wet etching process, etc. In one embodiment, the etching process is a wet etching process. The wet etching process may generate significantly small damages onto the dielectric layer 202 and the to-be-tested device structure 201. Various chemicals may be used for the wet etching process to remove the remained substrate 200. In one embodiment, the substrate 200 is made of silicon, thus KOH may be used for the wet etching process. The etching temperature may be in a range of approximately 100° C.-200° C. The etching time may be in a range of approximately 30 mins-60 mins.

Further, referring to FIG. 8, because the mark opening 206 may expose the surface of the substrate 200, after removing the substrate 200, the mark opening 206 may be exposed. The exposed mark opening 206 may be used to define the stop position of the subsequent etching process for removing the isolation structure 205.

Figure 9:
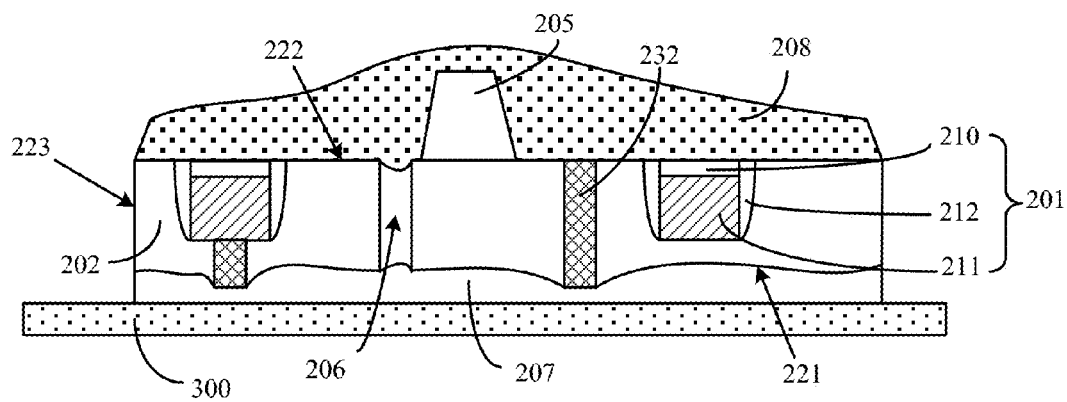

Returning to FIG. 13, after removing the substrate 200, a protective layer may be formed (S106). FIG. 9 illustrates a corresponding semiconductor structure. The semiconductor structure illustrated in FIG. 8 is rotated by 180° to be illustrated in the FIG. 9.

As shown in FIG. 9, a protective layer 208 is formed on the second surface 222 of the dielectric layer 202, the surface of the isolation structure 205 and the surface of the to-be-tested device structure 201. Further, the protective layer 208 may cover the top of the mark opening 206 so as to form a chamber in the mark opening 206. The protective layer 208 may cause the subsequent process for removing the isolation structure 205 to be easily controlled.

The protective layer 208 may be made of any appropriate material. In one embodiment, the protective layer 208 may be made of a material identical to that of the isolation structure 205, thus a subsequent process may remove the isolation structure 205 and the protective layer 208 simultaneously. In one embodiment, the protective layer 208 and the isolation structure 205 are both made of silicon oxide.

Various processes may be used to form the protective layer 208, such as a chemical vapor deposition (CVD) process, a physical vapor deposition (PVD) process, or an atomic layer deposition process, etc. The thickness of the protective layer 208 may be any appropriate value as long as the protective layer 208 is able to cover the isolation structure 205.

Figure 10:
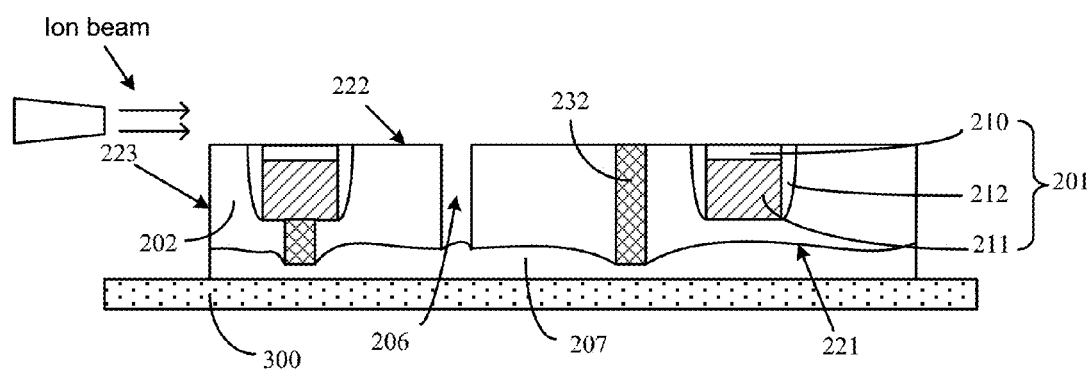

Returning to FIG. 13, after forming the protective layer 208, the protective layer 208 and the isolation structure 205 may be removed (S107). FIG. 10 illustrates a corresponding semiconductor structure.

As shown in FIG. 10, the protective layer 208 and the isolation structure 205 are removed; and the mark opening 206, the second surface 222 of the dielectric layer 202 and the surface of the to-be-tested device structure 201 are exposed. The protective layer 208 and the isolation structure 205 may be removed by any appropriated process. In one embodiment, the protective layer 208 and the isolation structure 205 may be removed by a second FIB process.

The ion source of the second FIB process may be one or more of gallium ions, or inert gas, etc. The accelerating voltage of the second FIB process may be in a range of approximately 1 kV-30 kV. Because the accelerating voltage may be relatively small, the second FIB process may generate substantially small damages to the second surface 222 of the dielectric layer 202 and the surface of the to-be-tested device structure 201.

Figure 12:
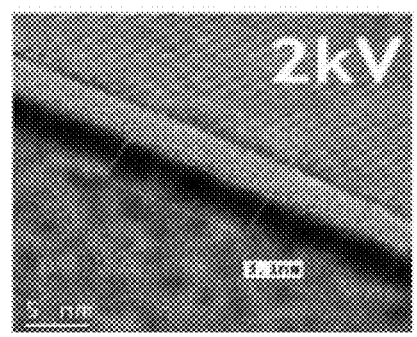
FIG. 12 illustrates an exemplary SEM image of defects on the second surface of the dielectric film and the surface of the to-be-test device structure caused by a second focused ion beam etching process consistent with the disclosed embodiments.

FIG. 12 illustrates a scanning electron microscopy (SEM) image of the defects on the surface of the second surface 222 of the dielectric layer 202 and the to-be-tested device structure 201 caused by the second FIB process. The accelerating voltage of the second FIB process is approximately 2 kV, and the depth of the defect on the second surface 222 of the dielectric layer 202 and the to-be-tested device structure 202 may be in a range of approximately 3 nm~4 nm.

Referring to FIG. 10, the direction of the ion beam may be parallel with the second surface 222 of the dielectric layer 202. The pole piece of the FIB apparatus may be aligned with a certain position on the protective layer 208, and then the dielectric layer 202 and the isolation structure 205 may be gradually thinned until the mark opening 206 is exposed. Thus, the second surface 222 of the dielectric layer 202 and the surface of the to-be-tested device structure 201 may be exposed. The exposed second surface 222 of the dielectric layer 202 may level with the surface of the to-be-tested device structure 201; and the exposed second surface 222 of the dielectric layer 202 and the surface of the to-be-tested device structure 201 may be even.

In one embodiment, after removing the protective layer 208 and the isolation structure 205, a polishing process may be performed onto the exposed second surface 222 of the dielectric layer 202 and the surface of the to-be-tested device structure 201 to remove the defects on the second surface 222 of the dielectric layer 202 and the surface of the to-be-tested device structure 201 caused by the second FIB etching process. The polishing solution of the polishing process may be water; and the rotation speed of the polishing pad may be in a range of approximately 20 rpm~80 rpm.

Because the polishing solution may be water, and the rotation speed of the polishing pad may be relatively small, the polishing process may be able to remove the defects on the second surface 222 of the dielectric layer 202 and the surface of the to-be-tested device structure 201 caused by the second FIB process, but it may not cause a secondary damage onto the second surface 222 of the dielectric layer 202 and the surface of the to-be-tested device structure 201. Thus, the polishing process may be able to cause the exposed second surface 222 of the dielectric layer 202 and the surface of the to-be-tested structure 201 to be smooth and even; and it may aid the subsequent SCM testing. Further, the morphology of the to-be-tested device structure 201 may be complete and accurate; the SCM testing results may be significantly accurate.

In one embodiment, after performing the first planarization process onto the conductive structures and the dielectric layer, the first surface of the dielectric layer may be bonded with a dummy wafer; and then the substrate and the isolation structure may be removed to expose the second surface of the dielectric layer and the surface of the to-be-tested device structure. The exposed second surface of the dielectric layer and the surface of the to-be-tested device structure may be used as the testing surface for the SCM testing. Because the second surface of the dielectric layer and the surface of the to-be-tested device structure may be exposed by removing the substrate, the second surface of the dielectric layer may level with the surface of the to-be-tested device structure. That is, the second surface of the dielectric layer and the surface of the to-be-tested device structure may be significantly even and smooth; and it may be able to avoid the rough surface issues caused by a polishing process. Thus, the second surface of the dielectric layer and the surface of the to-be-tested device structure may match the requirements for performing a SCM testing; and the probe of the SCM may not be damaged during a scanning process. Further, because the second surface of the dielectric layer and the surface of the to-be-tested device structure may be exposed by removing the substrate, damages to the to-be-tested device structure caused by the difficulties to define the stop position of the polishing process may be avoided. Thus, the structure and the morphology of the to-be-tested device structure may be kept complete; and the testing results of the SCM testing may be significantly accurate.

Thus, a semiconductor testing structure may be formed by the above disclosed processes and methods; and a corresponding semiconductor testing structure is illustrated in FIG. 10. As shown in FIG. 10, the semiconductor testing structure includes a dummy wafer 300; and an adhesive layer formed on the dummy wafer 300. The semiconductor testing structure also includes a dielectric layer 202 with a first surface 221 bonded with surface of the dummy wafer 300 by the adhesive layer 207; and a to-be-tested device structure 201 formed in the dielectric layer 202 with a surface exposed by a second surface 222 of the dielectric layer 202. The second surface 222 of the dielectric layer 221 is relative to the first surface 221 of the dielectric layer 221; and the second surface 222 of the dielectric layer 202 levels with the surface of the to-be-tested device structure 201. The detailed structures and intermediate structures are described above with respect to the fabrication processes.

Therefore, according to the disclosed methods and device structures, the exposed second surface of the dielectric layer and the surface of the to-be-tested device structure may be used as the testing surface of the SCM testing. The second surface of the dielectric layer may level with the surface of the to-be-tested device structure. That is, the second surface of the dielectric layer and the surface of the to-be-tested device structure may be even and smooth. Thus, the second surface of the dielectric layer and the surface of the to-be-tested device structure may match the requirements for performing a SCM testing; and the probe of the SCM may not be damaged during the scanning process. Further, the structure and the morphology of the to-be-tested device structure may be kept complete; thus the testing results of the SCM testing may be significantly accurate.

Figure 11:
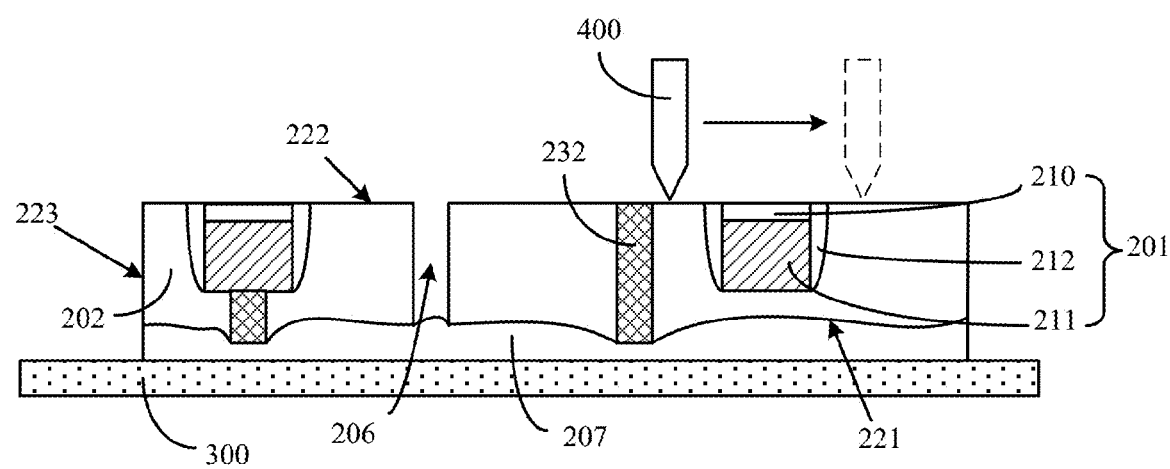
FIG. 11 illustrates a semiconductor testing structure consistent with the disclosed embodiments.

Further, a semiconductor testing method is also provided. FIGS. 10~11 illustrate certain semiconductor structures corresponding to the semiconductor testing method.

The semiconductor testing method includes providing a semiconductor testing structure. FIG. 10 illustrates a corresponding semiconductor testing structure.

As shown in FIG. 10, the semiconductor testing structure may include a dummy wafer 300; and an adhesive layer 207 formed on the dummy wafer 300. The semiconductor testing structure may also include a dielectric layer 202 with a first surface 221 bonded with surface of the dummy wafer 300 by the adhesive layer 207; and a to-be-tested device structure 201 formed in the dielectric layer 202 with a surface exposed by a second surface 222 of the dielectric layer 202. The second surface 222 of the dielectric layer 221 is relative to the first surface of the dielectric layer 221; and the second surface 222 of the dielectric layer 202 levels with the surface of the to-be-tested device structure 201.

Further, the semiconductor testing method may also include providing a testing apparatus having a probe. FIG. 11 illustrates a corresponding semiconductor structure.

The testing apparatus may be any appropriate testing apparatus, such as a scanning probe microscope (STM), etc. In one embodiment, the STM is a scanning capacitance microscope (SCM). As shown in FIG. 11, the SCM may include a probe 400 configured to raster scan on the surface of the to-be-tested device structure 201 to obtain certain type of testing information in the to-be-tested device structure 201.

Further, the semiconductor testing method also includes scanning the probe 400 on the surface of the to-be-tested device structure 201. That is, the probe 400 may be moved on the surface of the to-be-tested structure 400 to obtain the doping profile of the doping ions in the to-be-tested device structure 201. Parameters of the SCM, such as scanning rate, propositional gate, set point, etc., may be adjusted to obtain an optimized image of the doping profile.

Referring to FIG. 11, the second surface 222 of the dielectric layer 202 and the surface of the to-be-tested device structure 201 may be even and smooth, thus it may be suitable for the probe 400 to be moved on the second surface 222 of the dielectric layer 202 and the surface of the to-be-tested structure 201; and the probe 400 may not be damaged. Further, the second surface 222 of the dielectric layer 202 and the to-be-tested device structure 201 may not be damaged; and the testing results of the SCM testing may be significantly accurate.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor testing structure, comprising:
   providing a substrate having a device structure formed on a surface of the substrate, a dielectric layer formed on the surface of the substrate and a surface of the device structure, and conductive structures and an insulation layer electrically insulating the conductive structures formed on a first surface of the dielectric layer;
   planarizing the conductive structures and the insulation layer to remove the conductive structures and the insulation layer by a first planarization process until the first surface of the dielectric layer is exposed;
   bonding the first surface of the dielectric layer with a dummy wafer by an adhesive layer; and
   removing the substrate to expose a second surface relative to the first surface of the dielectric layer and a surface of the device structure.

2. The method according to claim 1, wherein:
   isolation structures are formed in the substrate.

3. The method according to claim 1, after the first planarization process and before bonding the first surface of the dielectric layer with the dummy wafer, further including:
   performing a second planarization process onto the substrate and the dielectric layer along a direction parallel to the surface of the substrate to form a third surface until the third surface and the device structure has a pre-determined distance; and
   forming a mark opening exposing the surface of the substrate in the dielectric layer.

4. The method according to claim 3, after removing the substrate, further including:
   forming a protective layer on the second surface of the dielectric layer, a surface of the isolation structure; and the surface of the device structure; and
   removing the protective layer and the isolation structure until the mark opening, the second surface of the dielectric layer and the surface of the device structure being exposed.

5. The method according to claim 3, wherein:
   the pre-determined distance is in a range of approximately 1 µm to 5 µm.

6. The method according to claim 3, wherein:
   the mark opening is formed by a first focused ion beam etching process;
   an ion source of the first focused ion beam etching process is one or more of gallium ions and inert gas ions; and
   an accelerating voltage of the first focused ion beam etching process is in a range of approximately 1 KV to 30 KV.

7. The method according to claim 4, wherein:
   the protective layer and the isolation structure are removed by a second focused ion beam etching process;
   an ion source of the second focused ion beam etching process is one or more of gallium ions and inert gas ions; and
   an accelerating voltage of the second focused ion beam etching process is in a range of approximately 1 KV to 30 KV.

8. The method according to claim 4, after removing the protective layer and the isolation structure, further including:
   performing a polishing process onto the second surface of the dielectric layer and the surface of the device structure using water as a polishing media and a polishing speed in a range of approximately 20 rpm~80 rpm.

9. The method according to claim 1, wherein removing the substrate further includes:
   thinning the substrate by a third planarization process until a thickness of the substrate reaches a pre-determined value; and
   etching remained substrate until the second surface of the dielectric layer and the surface of the structure are exposed.

10. The method according to claim 9, wherein:
    the third planarization process is a chemical mechanical polishing process;
    the etching process is a wet etching process; and
    an etching solution is an alkaline solution.

11. The method according to claim 10, wherein:
    the etching solution is a KOH solution;
    an etching temperature is in a range of approximately 100° C.~200° C.; and
    an etching time is a range of approximately 30 mins-60 mins.

12. The method according to claim 1, wherein:
    the device structure is a gate structure having a gate dielectric layer formed on the surface of the substrate, a gate electrode layer formed on the gate dielectric layer; and sidewall spacers formed on both sides of the gate dielectric layer and the gate electrode layer.

13. The method according to claim 1, wherein:
the conductive structures include a plurality of stacked conductive layers and conductive vias electrically connecting adjacent conductive layers formed between the conductive layers.

14. A semiconductor testing method, comprising:
providing a semiconductor testing structure having a device structure with an even and smooth testing surface;
providing a testing apparatus having a probe; and
moving the probe of the testing apparatus on the testing surface of the device structure of the semiconductor testing structure to obtain testing information in the device structure,
wherein the semiconductor testing structure includes:
a dummy wafer,
an adhesive layer formed on the dummy wafer;
a dielectric layer having a first surface bonded with the dummy wafer by the adhesive layer; and
the device structure formed in the dielectric layer with an even and smooth surface exposed by a second surface of relative to the first surface of the dielectric layer.

15. The semiconductor testing method according to claim 14, wherein:
the device structure is a gate structure.

16. The semiconductor testing method according to claim 14, wherein:
the testing apparatus is a scanning probe microscope; and
the testing information is a doping profile.

* * * * *